United States Patent
Miyagi

(10) Patent No.: US 7,049,895 B2
(45) Date of Patent: *May 23, 2006

(54) FET BAND AMPLIFIER

(75) Inventor: Hiroshi Miyagi, Jouetsu (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/170,227

(22) Filed: Jun. 28, 2005

(65) Prior Publication Data

US 2005/0237115 A1    Oct. 27, 2005

Related U.S. Application Data

(62) Division of application No. 10/467,519, filed as application No. PCT/JP02/01539 on Feb. 21, 2002.

(30) Foreign Application Priority Data

Feb. 22, 2001   (JP) .............................. 2001-047324

(51) Int. Cl.
   *H03F 3/68*   (2006.01)
(52) U.S. Cl. ...................... 330/310; 330/311
(58) Field of Classification Search ............... 330/133, 330/307, 310, 311
   See application file for complete search history.

(56) References Cited

U.S. PATENT DOCUMENTS 5,777,516 A    7/1998   Koifman et al. ............ 330/277
6,518,843 B1   2/2003   Fujita ........................ 330/284
6,870,696 B1*  3/2005   Cheung et al. ............... 360/46

FOREIGN PATENT DOCUMENTS

| CN | 1116773 A | 2/1996 |
|---|---|---|
| CN | 1158025 A | 8/1997 |
| JP | 63-46008 | 2/1988 |
| JP | 1-137710 | 5/1989 |
| JP | 4-306922 | 10/1992 |
| JP | 7-283659 | 10/1995 |
| JP | 8-55909 | 2/1996 |
| JP | 2533497 B | 9/1996 |
| JP | 8-335831 | 12/1996 |
| JP | 9-121021 | 5/1997 |

* cited by examiner

Primary Examiner—Steven J. Mottola

(74) Attorney, Agent, or Firm—Dellett & Walters

(57) ABSTRACT

An FET band amplifier for providing a high gain. An FET band amplifier 5 included in an AM receiver comprises amplifiers 11 to 15 e.g. at five stages and a BPF 16 inserted halfway in their connection. Each of the amplifiers 11 to 15 acts as a differential amplifier comprising a p-channel FET as an amplification element. The BPF 16 allows the passage of a component of a band wider than the amplification band of the whole of the FET band amplifier and reduces a 1/f noise by removing the low-band component of a signal amplified by the amplifiers 11 to 13 at three stages and thermal noise by removing the high-band component. Thus, each of the amplifiers 14, 15 connected to the rear stage of the BPF 16 is not saturated by a noise component.

15 Claims, 8 Drawing Sheets

FET BAND AMPLIFIER

BACKGROUND OF THE INVENTION

1. Field of the Invention

The present invention relates to an FET band amplifier used in various receivers and so on.

2. Description of the Related Art

Band amplifiers that amplify signals of a predetermined band in high gain are used in various kinds of receivers such as an AM receiver and an FM receiver. Typical band amplifiers include a high-frequency amplifier included in a front end and an intermediate frequency amplifier that amplifies intermediate frequency signals. In the high-frequency amplifier, only signals of in a predetermined band centering around a tuning frequency are selectively amplified. The center frequency in this case is set to be variable depending on the state of channel selection. In the intermediate frequency amplifier, only signals of a narrow band close to the intermediate frequency are selectively amplified. The center frequency in this case is set to a fixed value such that for example, the center frequency is 10.7 MHz in the case of the FM receiver, and the center frequency is 455 kHz in the case of the AM receiver. Generally, a multistage amplifier with transistors connected in multiple stages is used in case where a high gain is set in the band amplifier.

Incidentally, the band amplifier described above has a problem such that if a high gain is set, the multistage amplifier may be saturated with the noise component, thus making it impossible to obtain a gain realizable in design.

SUMMARY OF THE INVENTION

The present invention has been created in consideration of the above-described points, and an object of the present invention is to provide an FET band amplifier which can obtain a high gain.

In order to solve the above-mentioned problem, an FET band amplifier of the present invention is provided in amplifiers cascaded in a plurality of stages in which FETs are used as amplifier elements and a band-pass filter inserted in mid-stage of these amplifiers of multiple stages and adjusted to have a passing band wider than an amplification band. Furthermore, p-channel FETs are used as FETs of at least first to nth-stage amplifiers. It is possible, by using the band-pass filter having a passing band wider than the amplification band, to eliminate 1/f noise existing on a lower-frequency side than the passing band and thermal noise existing on a higher-frequency side than that. Furthermore, a noise occurring in the amplifier can be further reduced by using as an amplification element a p-channel FET having a small mobility. Therefore, it is possible to prevent the amplifiers from being saturated with such noise component, and only a signal component to be originally amplified can be amplified so that a high gain can be obtained as the entire FET band amplifier. Furthermore, by using an FET as an amplification element, the entire FET band amplifier can be fabricated on a semiconductor substrate in a process for producing FETs, thus making it possible to make an integration process easier and achieve a reduction of costs and savings in space, compared to the case where a bipolar transistor is used as an amplification element.

Particularly, the above amplifier is a differential amplifier that differentially operates two FETs, and where the number of stages in which noise components are accumulated so that the amplifier becomes saturated is m, it is desirable that the band-pass filter is placed after amplifiers cascaded in a number smaller than m. Since the band-pass filter is inserted so that the number of cascaded stages is smaller than m, the amplifiers after the mth stage can be prevented from being saturated by noise components, thus making it possible to increase the gain of the entire FET band amplifier.

Furthermore, the FET band amplifier of the present invention comprises amplifiers of multiple stages cascaded in which FETs are used as amplification elements. The amplifier of each stage has a high-band component elimination unit for eliminating components of bands higher than the upper limit of amplification band components from input/output signals and a low-band component elimination unit for eliminating components of bands lower than the lower limit of the amplification band components from input/output signals. And p-channel FETs are used as FETs of at least first to nth-stage amplifiers. In the amplifier of each stage, components other than those of the amplification band are eliminated, therefore the gain is not limited by noise components. Furthermore, a noise occurring in the amplifier can be further reduced by using as an amplification element a p-channel FET having a small mobility, thus making it possible to obtain a high gain as the entire FET band amplifier.

In particular, it is desirable that the above-mentioned low-frequency component elimination unit be a high-pass filter in which a cutoff frequency is set at a value lower than the lower limit of the amplification band. It is possible, by providing the high-pass filter on the amplifier in each stage, to easily eliminate the 1/f noise lower than the cutoff frequency of the high-pass filter.

In addition, it is desirable that the above-mentioned amplifier be the differential amplifier for differentially operating two FETs, and the low-frequency component elimination unit be a feedback circuit for inputting the signal in which low-frequency components of differential output signals of the amplifier in each stage are synthesized in phase to the two FETs. It is possible, by synthesizing only the low-frequency components included in the differential output signals of the differential amplifiers and feeding them back in phase to an input side, to stop differential operation of the differential amplifiers corresponding to the low-frequency components so as to reduce the 1/f noise included in the low-frequency components.

Furthermore, the FET band amplifier of the present invention includes amplifiers of multiple stages cascaded in which FETs are used as amplification elements. The amplifier of each stage has a high-band component elimination unit for eliminating components of bands higher than the upper limit of amplification band components from inputted/outputted signals and p-channel FETs are used as FETs of at least first to nth-stage amplifiers. And the FET band amplifier has the feedback circuit for feeding back the components lower-frequency than the lower limit of amplification band components included in the output signal of the amplifier in the final stage to the first-stage amplifier in a reversed phase. As only the low-frequency components included in the output signal of the final-stage amplifier are fed back to the input side of the first-stage amplifier in the reversed phase and the low-frequency components are thereby cancelled, it is possible to eliminate the 1/f noise included in the low-frequency components. The 1/f noise itself occurring in the amplifier can be reduced by using as an amplification element a p-channel FET having a small mobility.

In particular, it is desirable that the above-mentioned high-frequency component elimination unit be a low-pass filter in which the cutoff frequency is set at a value higher than the upper limit of the amplification band. It is possible, by providing the low-pass filter on the output side of the amplifier in each stage, to easily eliminate the thermal noise higher than the cutoff frequency of the low-pass filter.

It is also desirable to use a parasitic capacitance of an FET included in the amplifier in the next stage as a capacitor included in the low-pass filter. It is possible, by utilizing the parasitic capacitance of the FET instead of the capacitor as a stand-alone component, to reduce the number of components and thereby reduce the cost. Particularly, a parasitic capacitance occurs in the FET formed on a semiconductor substrate and therefore, by taking advantage of this, spaces on the semiconductor substrate can be used effectively and tips can be downsized compared to the case where a single capacitor is used to fabricate a low-pass filter.

Furthermore, the FET band amplifier of the present invention comprises amplifiers of multiple stages cascaded in which FETs are used as amplification elements, and p-channel FETs are used as FETs of at least up to mth-stage amplifiers. It is possible, by using the p-channel FETs of which mobility is small, to curb occurrence of the 1/f noise so as to prevent the amplifiers from being saturated with the 1/f noise.

It is also desirable to use n-channel FETs as the amplification elements included in the amplifiers from an m+1-th stage onward. It is possible, by using the n-channel FETs as the amplification elements included in the amplifiers in the subsequent stages which do not contribute so much to prevention of saturation of the amplifiers, to render the space of component parts smaller compared to the case of entirely using the p-channel FETs.

It is also desirable to set a channel length L and a channel width W of the FETs included in the amplifiers up to the m-th stage at values larger than the channel length L and the channel width W of the FETs included in the amplifiers from the m+1-th stage onward. It is possible, by setting at large values only the channel length L and the channel width W of the FETs included in the amplifiers in the foregoing stages which significantly contribute to the prevention of saturation of the amplifiers, to render the space of component parts smaller compared to the case of rendering these values larger for all the FETs.

It is also desirable, when attention is paid to the FETs included in the plurality of amplifiers connected in the multiple stages as the amplification elements, to set the channel length L and the channel width W of the FETs included in the amplifiers placed in the foregoing stages at values larger than the channel length L and the channel width W of the FETs included in the amplifiers placed in the subsequent stages thereto. It is generally known that the 1/f noise generated in the FETs increases in proportion to the respective reciprocals of the channel length L and the channel width W. Therefore, it is possible, by setting the channel length L and the channel width W large, to reduce the 1/f noise generated in the FETs. In particular, when considering the FETs connected in the multiple stages, the 1/f noise generated in the FETs included in the foregoing stages is amplified in the FETs in the subsequent stages thereto so that it is desirable to reduce the 1/f noise generated in the FETs included in the foregoing stages for the sake of reducing overall low-frequency noise. Moreover, the 1/f noise generated in the FETs included in the subsequent stages is amplified to a lesser degree in the FETS in the more subsequent stages so that it supposedly contributes less to reduction in the overall low-frequency noise. Therefore, it is possible, by setting the channel length L and the channel width W in the FETs included in the subsequent stages at values smaller than those of the FETs in the preceding stages, to reduce the space occupied by the FETS so as to reduce the costs by miniaturizing the chips.

It is also desirable, when attention is paid to the FETs included in the plurality of amplifiers connected in the multiple stages as the amplification elements, to set the channel length L and the channel width W of each FET so that the noise component generated by the FET becomes smaller than that included in an input signal of the FET. It is possible, by rendering the noise component generated by any of the FETS smaller than that included in the input signal of the FET, to reduce the overall low-frequency noise.

It is also desirable to have the component parts integrally formed on a semiconductor substrate by using a CMOS process or a MOS process. It is possible, by using these processes, to simplify the process compared to the cases of using a bipolar process and so on so as to allow the component costs and the product costs including the FET band amplifier to be reduced.

It is also desirable that the above-mentioned semiconductor substrate have an N-well formed thereon and all or a part of the component parts be formed on the N-well. It is possible, by forming all or a part of the component parts on the N-well, to prevent a noise current from running via a pn joint surface formed between the N-well and the semiconductor substrate under it so as to prevent the noise generated in the circuit on the N-well from running round to another component through the semiconductor substrate.

It is also desirable that the above-mentioned semiconductor substrate have a guard ring formed around the component parts. It is thereby possible to further effectively prevent the noise generated in the circuit formed on the N-well from running round to another component through the semiconductor substrate.

It is also desirable to have the above-mentioned guard ring formed from a semiconductor substrate surface down to a position deeper than the N-well. It is possible, by forming the guard ring to the deep position, to eliminate the 1/f noise in a low-frequency area running round beyond the guard ring.

DETAILED DESCRIPTION OF THE PREFERRED EMBODIMENTS

Hereafter, an FET band amplifier according to an embodiment to which the present invention is applied will be described in detail.

First Embodiment

Figure 1:
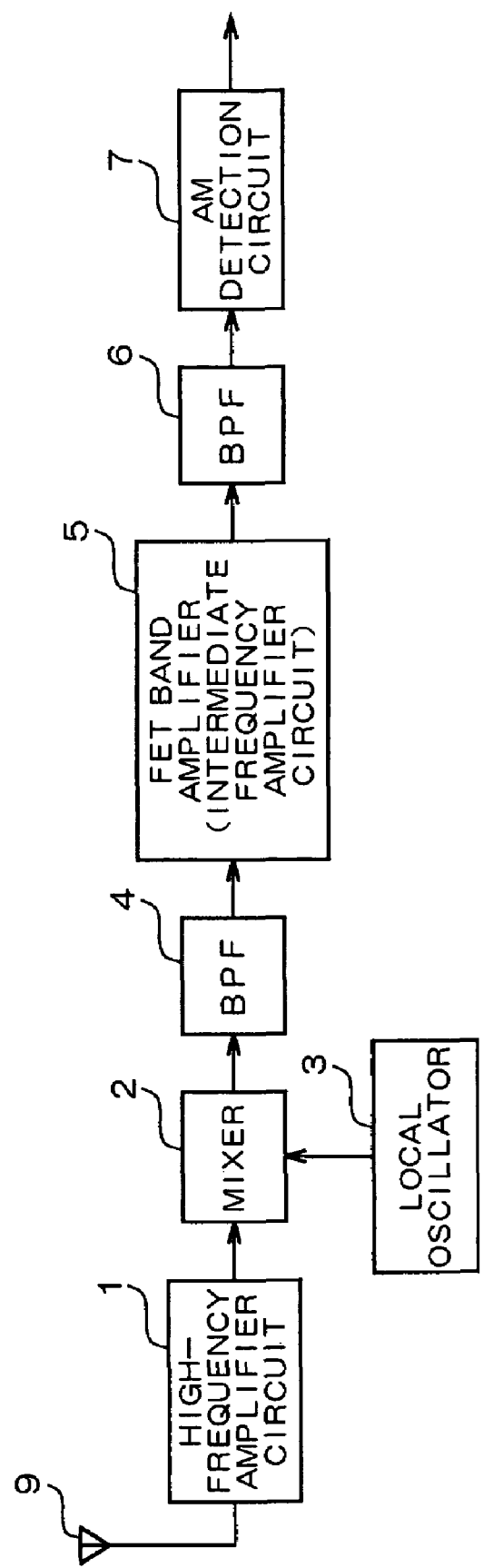
FIG. 1 is a diagram showing a general configuration of an AM receiver including an FET band amplifier according to a first embodiment.

FIG. 1 is a diagram showing a general configuration of an AM receiver including the FET band amplifier according to a first embodiment. As shown in FIG. 1, the AM receiver has a high-frequency amplifier circuit 1, a mixer 2, a local oscillator 3, BPF (Band-pass Filter) 4 and BPF 6, an FET band amplifier 5 and an AM detection circuit 7. An AM wave received by an antenna 9 is amplified by a high-frequency amplifier circuit 1 and then a local oscillation signal outputted from a local oscillator 3 is mixed so as to perform a frequency conversion from a high-frequency signal to an intermediate frequency signal. For instance, if a frequency of a signal outputted from the high-frequency amplifier circuit 1 is f1 and the frequency of the local oscillation signal outputted from the local oscillator 3 is f2, a signal having the frequency of f1–f2 is outputted from a mixer 2.

BPFs 4 and 6 are provided in foregoing and subsequent stages of an FET band amplifier 5 functions as an intermediate frequency amplifier circuit, and extract only a frequency component in proximity to 455 kHz from an inputted intermediate frequency signal. The FET band amplifier 5 amplifies the predetermined band components including the intermediate frequency signal. An AM detection circuit 7 performs AM detection processing for the intermediate frequency signal amplified by the FET band amplifier S.

Figure 2:
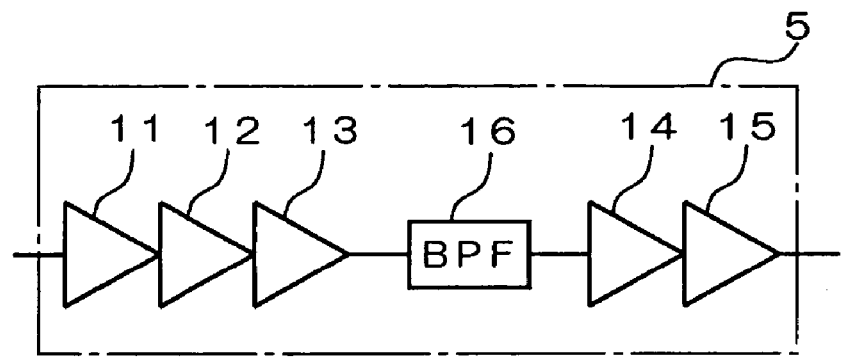
FIG. 2 is a diagram showing a configuration of the FET band amplifier according to the first embodiment.

FIG. 2 is a diagram showing a configuration of the FET band amplifier 5 according to this embodiment. As shown in FIG. 2, the FET band amplifier 5 according to this embodiment is comprised of the amplifiers in five stages 11 to 15 and a BPF 16 inserted between a third-stage amplifier 13 and a fourth-stage amplifier 14. Each of the amplifiers 11 to 15 has a predetermined gain, and the FET band amplifier 5 in its entirety has the gain wherein the gains of the amplifiers 11 to 15 are multiplied. The FET band amplifier 5 is integrally formed on a semiconductor substrate together with other circuits by using a CMOS processor a MOS process. It is thereby possible to simplify a manufacturing process so as to reduce the component costs or the product costs of the entire AM receiver.

Figure 3:
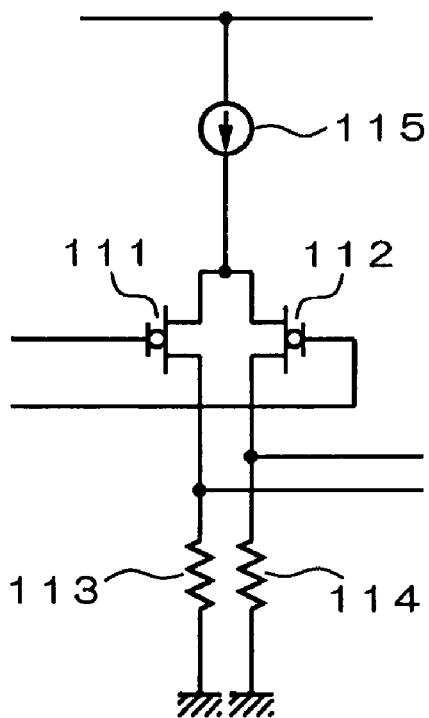
FIG. 3 is a circuit diagram showing a configuration of an amplifier included in the FET band amplifier shown in FIG. 2.

FIG. 3 is a circuit diagram showing the configuration of the amplifier 11. Moreover, the other amplifiers 12 to 15 also have the same configuration as the amplifier 11. As shown in FIG. 3, the amplifier 11 is comprised of a pair of p-channel MOS FET 111, 112, resistors 113, 114 which are drain resistors and a constant current circuit 115. The constant current circuit 115 is connected in common to the respective sources of the two FETs 111, 112. For this reason, the total of currents running between the source and drains of the FETs 111, 112 is equal to the current generated by the constant current circuit 115. In addition, the signal outputted from a circuit in the foregoing stage is inputted between the gates of the two FETs 111, 112.

Thus, the amplifier 11 has the two FETs 111, 112 for performing differential operation, and has the gain $A_1$, for instance. Where the gains of other amplifiers 12 to 15 are $A_2$, $A_3$, $A_4$ and $A_5$, respectively, a gain of $A_1 A_2 A_3 A_4 A_5$ can be achieved theoretically for the entire FET band amplifier 5.

However, usually even though such a high gain is to be obtained, there may be cases where amplifiers of rear stages are saturated by the 1/f noise and the thermal noise, thus making it impossible to obtain a high gain as desired. In particular, in the case of the MOS FETs 111, 112, influence of the 1/f noise conspicuously appears.

In general, the 1/f noise is the noise appearing in a low-frequency area of the signal, and the lower the frequency becomes, the higher a noise level becomes. Inversely, the thermal noise is the noise appearing in a high-frequency area of the signal, and the higher the frequency becomes, the higher the noise level becomes. A noise voltage $v_n$ generated by the MOS FETs can be represented as follows.

$$v_n = \sqrt{((8kT(1+\eta)/(3g_m) + KF/(2f \text{Cox} WLK'))\Delta f)} \quad (1)$$

Here, k is a Boltzmann's constant, T is an absolute temperature, $g_m$ is a mutual conductance, Cox is a capacity between the gate and channel sandwiching a gate oxide film, W is a gate width, L is a gate length, f is a frequency and $\Delta f$ is a bandwidth of the frequency f. KF is a noise parameter which is a value between $10^{-20}$ and $10^{-25}$ or so. $\eta$ and K' are predetermined parameters.

In this formula, the first term on the right side indicates the thermal noise, and it apparently becomes larger in proportion as a temperature (T) rises. The second term on the right side indicates the 1/f noise, and it is apparently in proportion to the reciprocal of f.

If the noise (total of the 1/f noise and thermal noise) generated in each of the amplifiers 11 to 15 is $e_{n1}$, $e_{n2}$, $e_{n3}$, $e_{n4}$, $e_{n5}$, the noise levels $e_1$, $e_2$, $e_3$, $e_4$, $e_5$ included in each of the output signals of the amplifiers 11 to 15 are as follows.

$$
\begin{aligned}
e_1 &= e_{n1} \\
e_2 &= e_1 A_2 + e_{n2} \\
    &= e_{n1} A_2 + e_{n2} \\
e_3 &= e_2 A_3 + e_{n3} \\
    &= (e_{n1} A_2 + e_{n2}) A_3 + e_{n3} \\
e_4 &= e_3 A_4 + e_{n4} \\
    &= ((e_{n1} A_2 + e_{n2}) A_3 + e_{n3}) A_4 + e_{n4} \\
e_5 &= e_4 A_5 + e_{n5} \\
    &= (((e_{n1} A_2 + e_{n2}) A_3 + e_{n3}) A_4 + e_{n4}) A_5 + e_{n5}
\end{aligned}
\quad (2)
$$

In this way, signals inputted/outputted between amplifiers 11 and 15 each include a 1/f noise mainly existing in a low frequency area and a thermal noise mainly existing in a high frequency area, and the level of noise is amplified and a larger amount of noise is accumulated in the amplifier closer to the rearmost amplifier. Thus, if the level of noise exceeds a saturation level $E_0$ of amplifiers 11 to 15, outputs of subsequent amplifiers are clipped.

For avoiding this problem, the BPF 16 is used in the FET band amplifier 5 of this embodiment. The BPF 16 is intended for allowing components of the amplification band (components included in a signal that are to be amplified) to pass through and removing the 1/f noise and the thermal noise described above. In the case of the AM receiver according to this embodiment shown in FIG. 1, it is sufficient if the FET band amplifier 5 can amplify only the band of the intermediate frequency signal in proximity to 455 kHz. Therefore, as for a characteristic of the BPF 16, it is necessary to set the lower cutoff frequency (kHz) at a value equal to or lower than 455−α (2α is the band of the intermediate frequency signal) and capable of sufficiently eliminating the 1/f noise and also set the upper cutoff frequency at a value equal to or higher than 455+α and capable of sufficiently eliminating the thermal noise.

Furthermore, where the number of stages such that the noise level $e_1$ to $e_5$ of each amplifier 11 to 15 does not exceed a saturation level $E_0$ is m, the BPF 16 should be placed after amplifiers cascaded in a number smaller than this number of stages m. In this embodiment, assuming that the noise level $e_3$ included in the output signal of the third-stage amplifier 13 is equal to or lower than the saturation level $E_0$, and the noise level $e_4$ included in the output signal of the fourth-stage amplifier 14 is equal to or higher than the saturation level $E_0$, the BPF 16 is inserted between the third-stage amplifier 13 and the fourth-stage amplifier 14.

In this way, the situation can be prevented in which amplifiers 14, 15 connected after the BPF 16 are saturated due to an increase in noise components.

In this way, in the FET band amplifier 5 of this embodiment, the BPF 16 is inserted between the third-stage amplifier 13 and the fourth-stage amplifier 14 so that the 1/f noise and the thermal noise amplified before the BPF 16 are removed. Therefore, the amplifiers 14 and 15 in the subsequent stage thereto will not be saturated with these noise components and have the gain limited, and so the FET band amplifier 5 in its entirety can secure the high gain.

Furthermore, by using the p-channel FET having a small mobility as an FET included as an amplification element in each amplifier 11 to 15, a noise occurring in each amplifier can be further reduced. Therefore, saturation of each amplifier due to an increase in noise components can be further inhibited, thus making it possible to reliably obtain a high gain as the entire FET band amplifier 5.

Particularly, the MOS-type FET has a large amount of 1/f noise compared to the bipolar transistor, and therefore if amplifiers are connected in multiple stages to form the FET band amplifier 5, the 1/f noise may be increased and thus it may become impossible to obtain required gain. Therefore, if the CMOS process or MOS process is used to form integrally all the parts including the FET band amplifier 5 or other circuits on a semiconductor substrate, it is effective to use the p-channel FET to reduce the 1/f noise for practical use.

Furthermore, the BPF 16 is inserted between the third-stage amplifier 13 and the fourth-stage amplifier 14 in this embodiment, but the BPF 16 may be placed at a location closer to the foremost stage. In addition, if the level of noise is again increased to reach the saturation level $E_0$ in amplifiers of multiple stages connected after the BPF 16, second or subsequent BPFs may be placed.

Furthermore, the p-channel FET is used for all amplifiers 11 to 15 in this embodiment, but the p-channel FET may be used for amplifiers of first to nth (e.g. second stage) stages having a significant effect in reduction of a noise. It is thereby possible to reduce accumulated noise components efficiently.

Second Embodiment

One BPF is inserted after the third-stage amplifier 13 to remove noise components in the first embodiment described above, but noise components may be removed in the amplifier of each stage.

Figure 4:
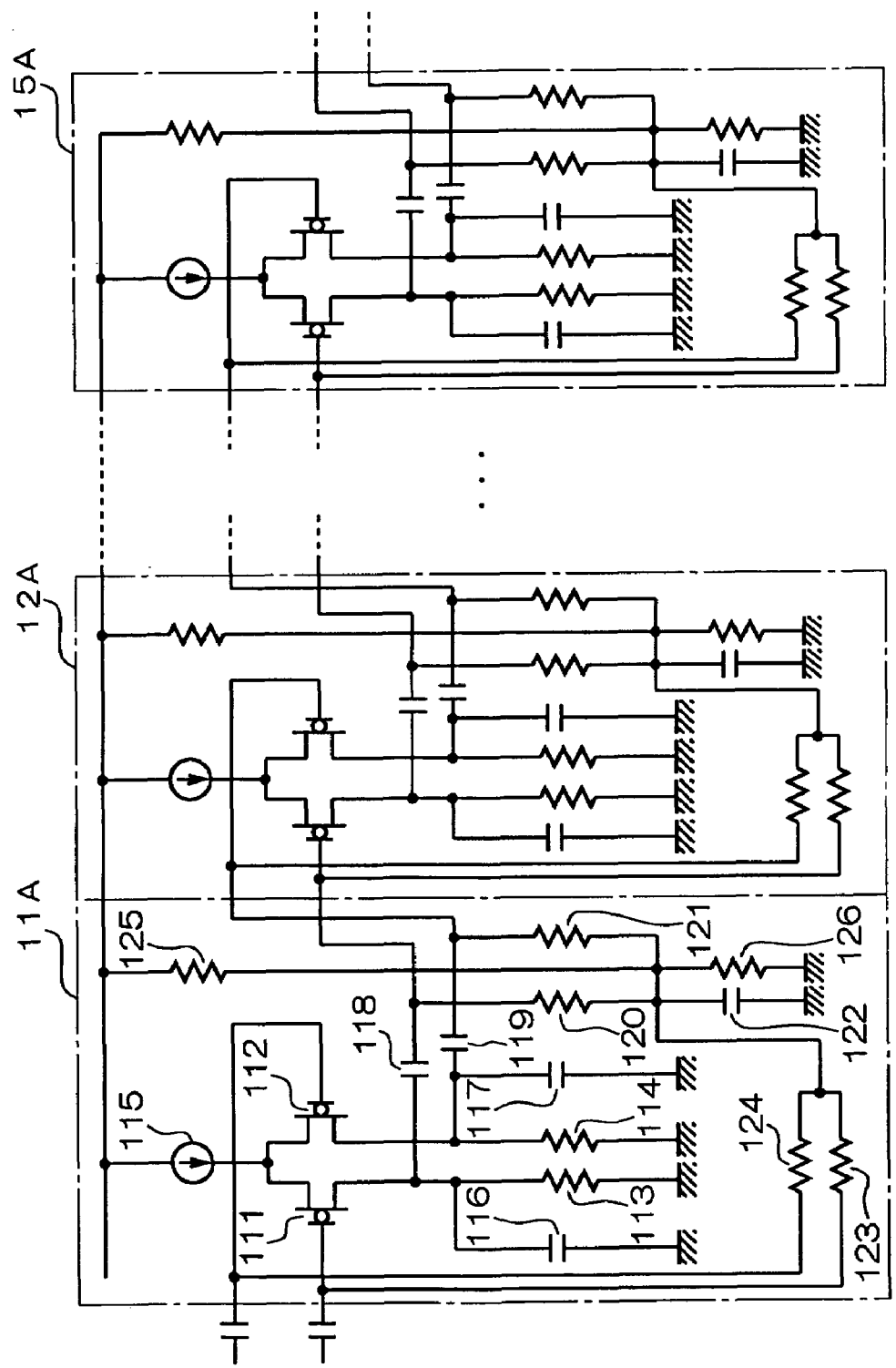
FIG. 4 is a circuit diagram showing a configuration of an FET band amplifier according to a second embodiment.

FIG. 4 is a circuit diagram showing the configuration of the FET band amplifier according to a second embodiment. The FET band amplifier according to this embodiment shown in FIG. 4 is constituted by cascading the amplifiers in five stages 11A, 12A, ... 15A. As the configurations of these amplifiers are basically the same, the detailed configuration and operation will be described hereafter by paying attention to the first-stage amplifier 11A.

The amplifier 11A is comprised of two p-channel MOS FETs 111, 112, eight resistors 113, 114, 120, 121, 123, 124, 125 and 126, a constant current circuit 115 and five capacitors 116 to 119 and 122. Of these, the FETS 111, 112, the resistors 113, 114 and the constant current circuit 115 are in common with the configuration of the amplifier 11 shown in FIG. 3, and so they are given the same reference numerals.

The capacitor 116 is connected in parallel to the resistor 113 which is the drain resistor of the one FET 111, and eliminates a high-frequency component included in one output signal outputted from the drain of the FET 111. Likewise, the capacitor 117 is connected in parallel to the resistor 114 which is the drain resistor of the other FET 112, and eliminates the high-frequency component included in the other output signal outputted from the drain of the FET 112. These resistors 113, 114 and capacitors 116, 117 correspond the high-frequency component elimination unit.

The capacitor 118 eliminates a DC component from the one output signal outputted from the drain of the FET 111 and inputted to the amplifier 12A in the subsequent stage. In addition, the capacitor 118 constitutes an HPF (high-pass filter) together with the resistor 120, and the low-frequency component included in the signal outputted from the FET 111 is eliminated by the HPF.

Likewise, the capacitor 119 eliminates the DC component from the other output signal outputted from the drain of the FET 112 and inputted to the amplifier 12A in the subsequent stage. In addition, the capacitor 119 constitutes the HPF together with the resistor 121, and the low-frequency component included in the signal outputted from the FET 111 is eliminated by the HPF.

The resistors 125, 126 are intended to set a bias voltage of the FETs 111, 112.

In addition, the respective one ends of the above-mentioned resistors 120, 121 are connected in common, and the capacitor 122 is inserted between this connection point and a ground. An LPF (low-pass filter) is constituted by the resistors 120, 121 and capacitor 122. To be more specific, the signals separately outputted from the FETs 111, 112 have only the low-frequency components extracted by this LPF, and are fed back as the signals in phase to the gates of the FETs 111, 112 via the resistors 123, 124 respectively. Consequently, the low-frequency components in the signals inputted to the first-stage amplifier 11A are inputted to the next-stage amplifier 12A at the as-is signal level without the FETs 111, 112 operating as the differential amplifiers. A feedback circuit comprised of the resistors 120, 121, 123, 124 and capacitor 122 corresponds the low-frequency component elimination unit.

Thus, in the first-stage amplifier 1A, the high-frequency components are eliminated from the signals outputted from the drain of the one FET 111 via the capacitor 116 so as to effectively eliminate the thermal noise generated by the FET 111. In addition, the low-frequency components are eliminated from the signals by the HPF comprised of the capacitor 118 and resistor 120 so as to effectively eliminate the 1/f noise generated by the FET 111.

Likewise, the high-frequency components are eliminated from the signals outputted from the drain of the other FET 112 via the capacitor 117 so as to effectively eliminate the thermal noise generated by the FET 112. In addition, the low-frequency components are eliminated from the signals by the HPF comprised of the capacitor 119 and resistor 121 so as to effectively eliminate the 1/f noise generated by the FET 112.

Furthermore, the low-frequency components included in the signals outputted from the respective drains of the FETs 111, 112 are fed back in phase to an input side by the LPF comprised of the resistors 120, 121 and the capacitor 122. As no amplifying operation in the amplifier 11A is performed as to these low-frequency components, the 1/f noise can be further reduced.

Incidentally, the above-mentioned amplifier 11A has the capacitors 116, 117 connected in parallel to the resistors 113, 114 respectively. However, it is also possible to insert the capacitors 116, 117 between the drain and a fixed potential other than ground of each of the FETs 111, 112.

As for the capacitors 116, 117, it is also possible to utilize a parasitic capacitance of the FETs included in the next-stage amplifier 12A.

Figure 5:
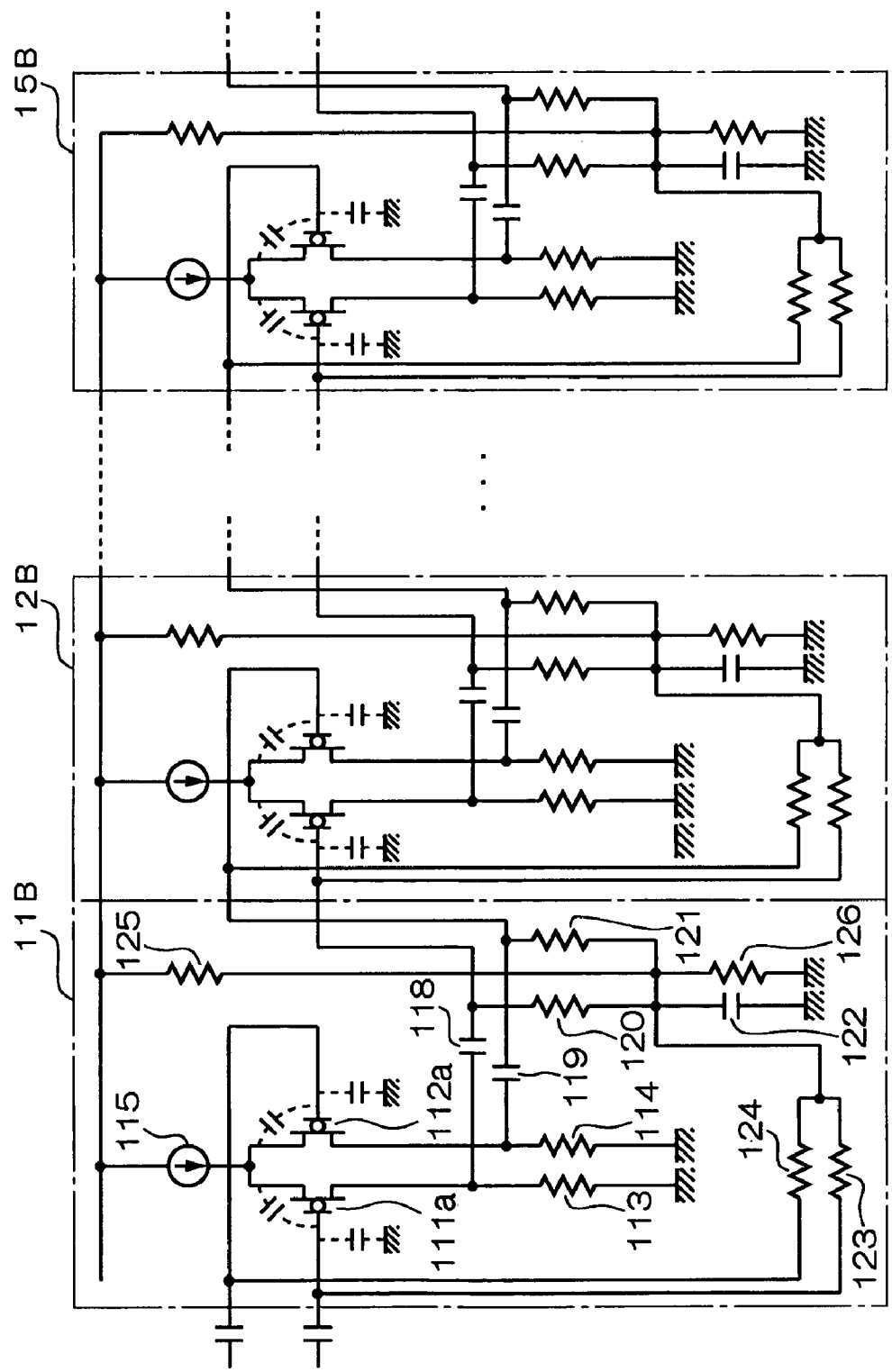
FIG. 5 is a circuit diagram showing a configuration of the FET band amplifier having the number of capacitors reduced by utilizing parasitic capacitance of FET.

FIG. 5 is a circuit diagram showing the configuration of the FET band amplifier having the number of the capacitors reduced by utilizing the parasitic capacitance of the FETs. The FET band amplifier shown in FIG. 5 is constituted by cascading amplifiers in five stages 11B, 12B, . . . , 15B. Compared to the configuration shown in FIG. 4, it is different in that the capacitors 116, 117 connected in parallel to the drain resistors are omitted and that the FETs 111, 112 are replaced by FETs 111a, 112a of which gate length L and gate width W are set larger.

It is generally known that a noise current generated by the FET is in proportion to the reciprocal of the gate length L. Therefore, it is possible to reduce the noise current by setting the gate length L longer. However, a channel resistor increases if the gate length L becomes longer, and so it is desirable to set the gate width W wider correspondingly to reduce the channel resistor. Thus, if the gate length L and the gate width W are set larger in order to reduce the noise current, the area of a gate electrode becomes larger and the parasitic capacitance also becomes larger. Therefore, it becomes possible to secure a capacity value of a certain level so that the parasitic capacitance can be used instead of the capacitors 116, 117.

Thus, it is possible, by increasing both the gate length L and the gate width W and thereby increasing the parasitic capacitance and then omitting the capacitors 116, 117, to eliminate the high frequency components of the signals, that is, the thermal noise, further effectively, not to mention that the costs can be reduced by omitting the capacitors 116, 117.

Third Embodiment

Figure 6:
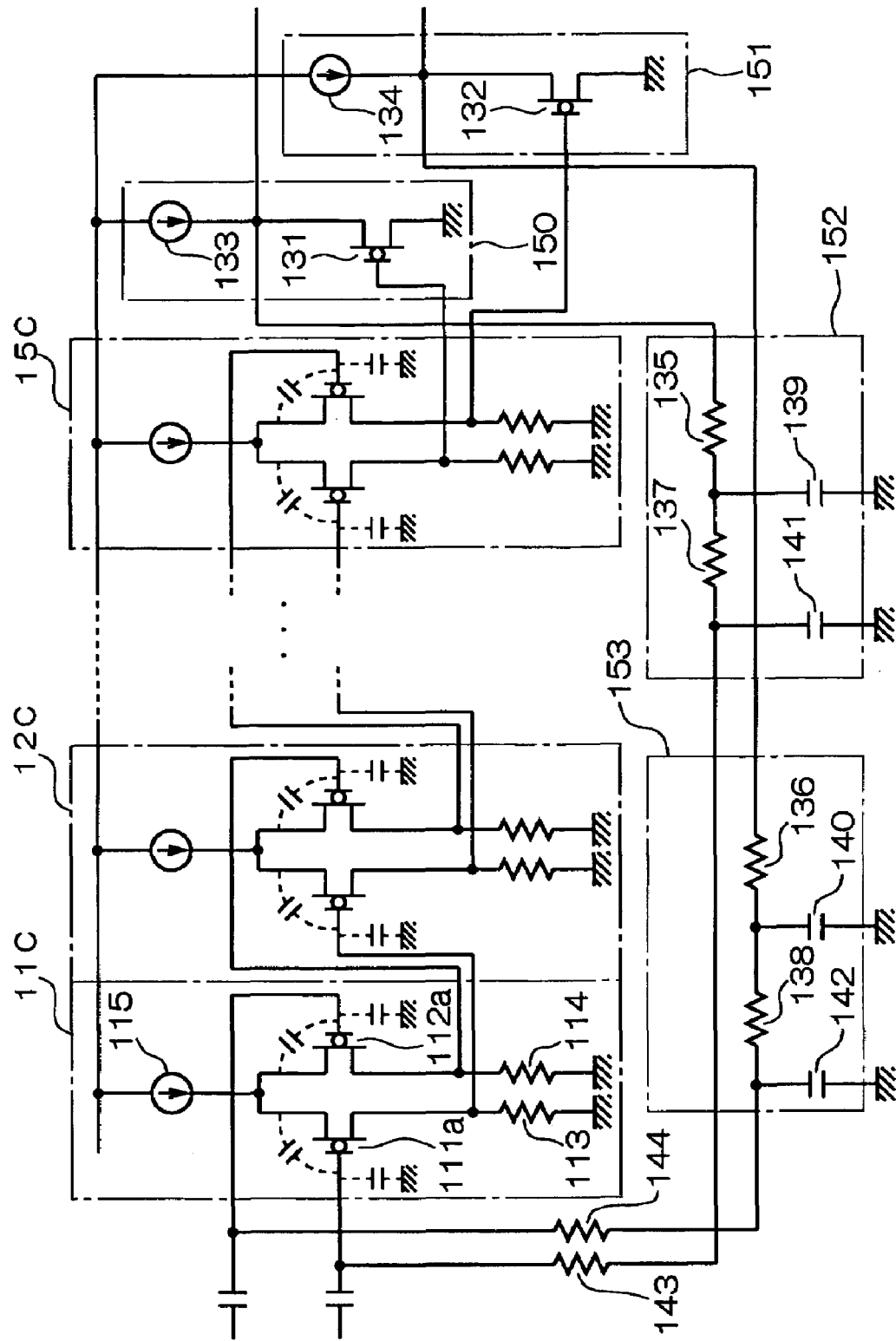
FIG. 6 is a circuit diagram showing a configuration of an FET band amplifier according to a third embodiment.

FIG. 6 is a circuit diagram showing the configuration of the FET band amplifier according to a third embodiment. The FET band amplifier according to this embodiment shown in FIG. 6 includes the amplifiers cascaded in five stages 11C, 12C, . . . 15C and an additional circuit for taking out the signal outputted from the final-stage amplifier 15C and feeding it back to the first-stage amplifier 11C.

As the configuration of each of the amplifiers 11C to 15C is the same, a description will be given hereafter by paying attention to the first-stage amplifier 11C.

The amplifier 11C is comprised of the FETs 111a, 112a, resistors 113, 114 and constant current circuit 115. The amplifier 11C has the configuration which is basically the same as the amplifier 11 shown in FIG. 3. However, the p-channel MOS FETs 111a, 112a shown in FIG. 5 are used instead of the FETs 111, 112. To be more specific, the FETs 111a, 112a have the gate length L and the gate width W set large so that the gate area of a size suited to eliminating the thermal noise included in the high-frequency components is secured. It is thereby possible to effectively eliminate the thermal noise included in the signals inputted to the amplifier in each stage.

In addition, the additional circuit provided to the FET band amplifier according to this embodiment includes a source follower circuit 150 comprised of an FET 131 and a constant current circuit 133, a source follower circuit 151 comprised of an FET 132 and a constant current circuit 134, an LPF 152 comprised of resistors 135, 137 and capacitors 139, 141 and an LPF 153 comprised of resistors 136, 138 and capacitors 140, 142.

One differential output signal outputted from the final-stage amplifier 15C is taken out as one output signal of the FET band amplifier via the source follower circuit 150, and is fed back to one input terminal of the first-stage amplifier 11C via the LPF 152 and a resistor 143. Likewise, the other differential output signal outputted from the final-stage amplifier 15C is taken out as the other output signal of the FET band amplifier via the source follower circuit 151, and is fed back to the other input terminal of the first-stage amplifier 11C via the LPF 153 and a resistor 144.

Incidentally, the FET band amplifier according to this embodiment includes the amplifiers in five stages (odd number) 11C to 15C, the phase of the signal outputted from the final-stage amplifier 15C is reversed to that of the signal outputted from the first-stage amplifier 11C. Therefore, extracting only the low-frequency component of the signal outputted from the source follower circuits 150, 151 with the LPFS 152, 153 and feeding it back to the first-stage amplifier 11C is nothing but to eliminate only this low-frequency component by reducing the gain corresponding to this component. To be more specific, it is possible, by forming a feedback loop shown in FIG. 6, to effectively eliminate the 1/f noise included in the low-frequency component.

Thus, it is also possible to effectively eliminate the 1/f noise by forming the feedback loop in the entire FET band amplifier and feeding back only the low-frequency component of the output signal to the input side of the first-stage amplifier 1C. In addition, it is possible, by eliminating the high-frequency components in the amplifiers in the stages 11C to 15C, to effectively eliminate the thermal noise included in the high-frequency components.

The FET band amplifier according to this embodiment shown in FIG. 6 eliminates the high-frequency component of the signal by utilizing the parasitic capacitance of the FET. However, it is also possible to use the capacitor as in the above-mentioned second embodiment shown in FIG. 4. In this case, the gate length L and the gate width W of the FET 111a and so on shown in FIG. 6 should be rendered smaller, and the capacitor should be connected in parallel to the resistors 113, 114.

Fourth Embodiment

The above-mentioned embodiments have the FET band amplifier constituted by providing the BPF and so on for eliminating the noise components included outside the band in use to the middle or each stage of the plurality of amplifiers connected in multiple stages. However, it is also possible to take countermeasures against the noise in the amplifier in each stage without providing the BPF and so on.

Figure 7:
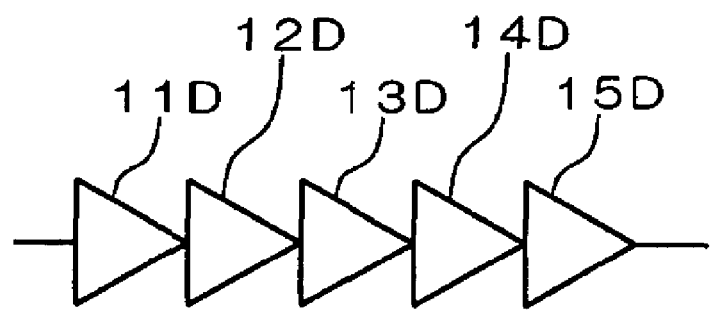
FIG. 7 is a diagram showing a configuration of an FET band amplifier according to a fourth embodiment.

FIG. 7 is a diagram showing the configuration of the FET band amplifier 5 according to this embodiment. The FET band amplifier shown in FIG. 7 comprises the plurality of amplifiers 11D to 15D connected in cascade. The FET band amplifier is integrally formed with the other circuits on the semiconductor substrate by using the CMOS process or the MOS process.

The above-mentioned plurality of amplifiers 11D to 15D have the countermeasures against the noise taken for the first to n-th stages. For instance, as for the countermeasures against the noise, a technique of using the p-channel MOS FETs and a technique of increasing the gate width W and gate length L of the MOS-type FETs are used independently or in combination.

As described above, it is possible to reduce the 1/f noise appearing in the low-frequency area by using the p-channel MOS FETs, which is the technique especially effective when integrally forming the FET band amplifier on the semiconductor substrate.

Figure 8:
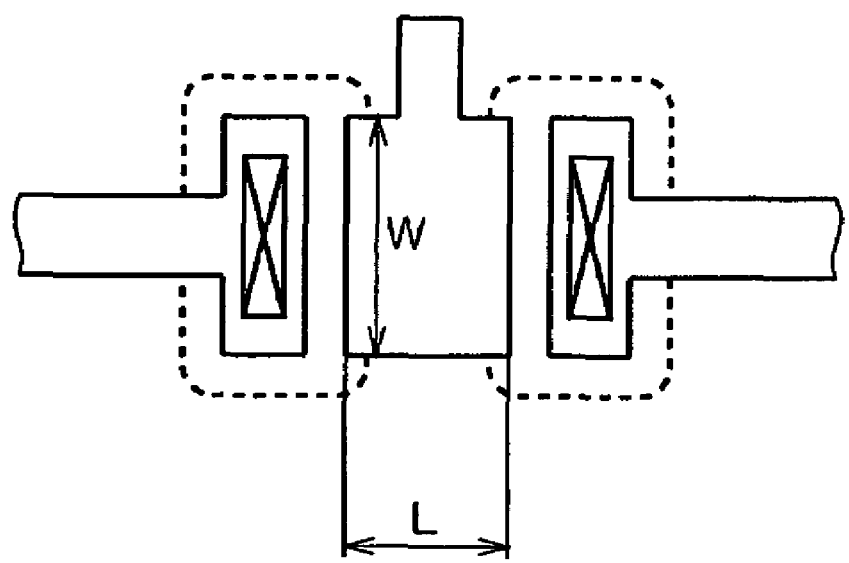
FIG. 8 is a diagram showing gate width W and gate length L of an MOS FETs.

FIG. 8 is a diagram showing the gate width W and the gate length L of the MOS FETS, where a plane view showing the entirety of the FETs formed close to the surface of the semiconductor substrate is presented.

As described above, the second term on the right side of the formula (1) indicates the 1/f noise and the gate width W and the gate length L are in a denominator therein. Therefore, it is shown that the 1/f noise can also be reduced by setting the gate width W and the gate length L at large values. In addition, if the gate width W and the gate length L are set large, the parasitic capacitance of the FET shown in FIG. 5 and the like also becomes large so that it also becomes effective for the sake of eliminating the thermal noise appearing in a high-frequency area.

Thus, it is possible, by taking the countermeasures against the noise in the amplifiers in the first to n-th stages, to prevent the amplifiers from being saturated with the noise components.

Incidentally, if the noise (total of the 1/f noise and thermal noise) generated in each of the amplifiers 11D to 15D is $e_{n1}$, $e_{n2}$, $e_{n3}$, $e_{n4}$ and $e_{n5}$, and the gain of each of the amplifiers 12D to 15D is $A_2$, $A_3$, $A_4$ and $A_5$, the noise levels $e_1$, $e_2$, $e_3$, $e_4$ and $e_5$ included in each of the output signals of the amplifiers 11D to 15D are as expressed as the above formula (2).

While the noise becomes the least by taking the countermeasures against the noise as to all the amplifiers 11D to 15D, the element area becomes larger compared to the case of using the n-channel FETS if all the FETs are the p-channel FETS. It is also the same in the case of increasing the gate width W and the gate length L, and the element area becomes larger if these countermeasures against the noise are taken. In particular, in the case of integrally forming the FET band amplifier on the semiconductor substrate, it is desirable to attempt a higher density and reduced costs due to reduction in the occupied space and take the above-mentioned countermeasures against the noise in the first to n-th stages in order to effectively prevent saturation of the amplifiers due to the reduction in the noise.

To be more precise, in the case where a noise level $e_m$ included in the output signal of the m-th stage amplifier is sufficiently larger (a few times larger, for instance) than the noise level occurring when taking no countermeasure against the noise as to the m+1-th stage amplifier, a sufficient effect cannot be expected even if the countermeasures against the noise are taken as to the amplifiers from the m+1-th stage onward, it is sufficient to take the above-mentioned countermeasure against the noise as to the amplifiers up to the m-th stage. It thereby becomes possible to obtain the effects of reducing the chip area and preventing the saturation with the noise in the case of integrally forming the FET band amplifier on the semiconductor substrate.

Incidentally, it is also possible to perform the following as to up to what stage the gate width W and the gate length L of the FETS included in the amplifiers therein should be larger than those of the FETs included in the amplifiers thereafter.

Considering the case of connecting the amplifiers in multiple stages, the 1/f noise generated by the FETs included in the amplifiers in the foregoing stage is amplified by the FETs included in the amplifiers in the subsequent stages thereto. Therefore, it is desirable to reduce the 1/f noise generated by the FETs included in the amplifiers in the foregoing stage for the sake of reducing the overall low-frequency noise. On the other hand, the 1/f noise generated by the FETs included in the amplifier in the subsequent stage is amplified to a lesser extent by the FETs included in the amplifiers in the more subsequent stages thereto, and so it supposedly contributes less to the reduction in the overall low-frequency noise. Therefore, it is possible, by setting the channel length L and the channel width W in the FETs included in the amplifier in the subsequent stage at values smaller than those of the FETs in the preceding stages, to reduce the space occupied by the FETs so as to reduce the costs by miniaturizing the chips.

It is also possible, when attention is paid to the FETs included in the amplifiers in an arbitrary position shown in FIG. 7, to set the channel length L and the channel width W of the FET included in each amplifier so that the noise component generated by the FET becomes smaller than that included in the input signal of the FET. It is possible, by rendering the noise component generated by the FETs included in any of the amplifiers smaller than that included in the input signal of the FET, to reduce the overall low-frequency noise.

It is also possible to apply the technique of using the p-channel MOS FETs to constitute the amplifiers up to m-th stage and using the n-channel MOS FETs to constitute the amplifiers from m+1-th stage onward to the FET band amplifiers according to the above-mentioned first to third embodiments. It is also possible, in this case, to obtain the effects of reducing the chip area and preventing the saturation due to the reduction in the noise.

Fifth Embodiment

In the case of integrally forming the FET band amplifier and the other circuits on the semiconductor substrate in the above-mentioned embodiments, the amplifier in each stage using the p-channel FETs as the amplification elements is formed on the N-well so as to prevent the noise from running round to another circuit through the semiconductor substrate.

Figure 9:
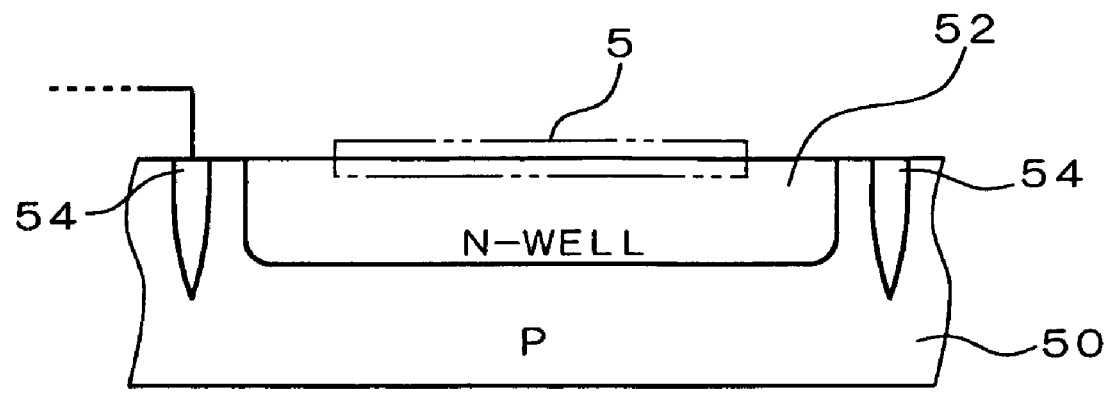
FIG. 9 is a plane view showing an outline configuration of an FET band amplifier according to a fifth embodiment.
Figure 10:
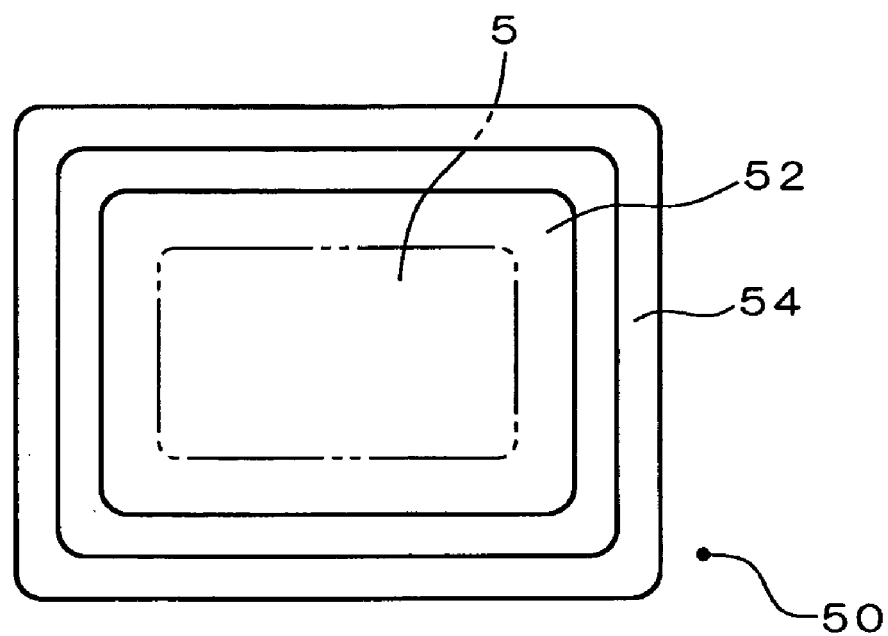
FIG. 10 is a sectional view of the configuration shown in FIG. 9.

FIG. 9 is a plane view showing an outline configuration of the FET band amplifier according to a fifth embodiment. FIG. 10 is a sectional view of the configuration shown in FIG. 9. As for the configuration in FIG. 9, in the case where the amplifier in each stage is constituted by using the p-channel FETs, all the components of the FET band amplifier 5 are formed on an N-well 52. In the case where the amplifier in each stage up to the m-th stage is constituted by using the p-channel FETs, all the components of each amplifier up to the m-th stage are formed on the N-well 52.

As a PN joint surface is formed between the N-well 52 and a P-type semiconductor substrate 50, the current running from the N-well 52 to the semiconductor substrate 50 is interrupted on the PN joint surface in the case where the potential of the N-well 52 is higher than that of the semiconductor substrate 50. For this reason, it is possible to prevent the noise generated in the circuit formed on the N-well 52 from running round to another circuit through the semiconductor substrate 50.

In particular, it is possible, by forming the amplifiers in the stages up to the m-th stage on the N-well 52, to prevent the noise generated in the amplifiers in the stages up to the m-th stage from running round to the amplifiers in the stages from the m+1-th onward through the semiconductor substrate 50 so as to further prevent the amplifiers in the stages from the m+1-th onward in the FET band amplifier from being saturated.

As shown in FIG. 10, a guard ring 54 is formed in an area surrounding the N-well 52 and the proximity of the surface of the semiconductor substrate 50. The guard ring 54 is a portion of a P-type semiconductor substrate 50 formed in an N-type area. As a PNP layer is formed by the guard ring 54 and semiconductor substrate 50, it is possible to effectively prevent the noise generated in the circuit formed on the N-well 52 from running round to another circuit through the proximity of the surface of the semiconductor substrate 50.

In particular, it is desirable to form the guard ring 54 so as to reach a deeper layer area of the semiconductor substrate 50, that is, a point deeper than the N-well 52 for instance. Thus, in the case where the noise generated in the circuit formed on the N-well 52 runs round to another circuit through the downside of the guard ring 54 (inside of the semiconductor substrate 50), it becomes possible to prevent a lower-frequency component from running round. Therefore, it is possible, by forming the amplifiers in the stages up to the m-th stage on the N-well 52, to prevent the 1/f noise generated in the amplifiers in the stages up to the m-th stage from running round to the amplifiers in the stages from the m+1-th onward through the downside of the guard ring 54 so as to further prevent the amplifiers in the stages from the m+1-th onward in the FET band amplifier from being saturated.

The present invention is not limited to the above embodiments, but a variety of modified implementations are possible with in the gist of the present invention. For instance, according to the above-mentioned embodiments, the FET band amplifier is constituted by the amplifiers cascaded in five stages, where the number of the stages may be changed as appropriate according to the level at which the gain of the entire FET band amplifier is to be set.

It is also feasible to combine the FET band amplifier 5 shown in the above-mentioned embodiments with an AGC (automatic gain control) circuit.

Figure 11:
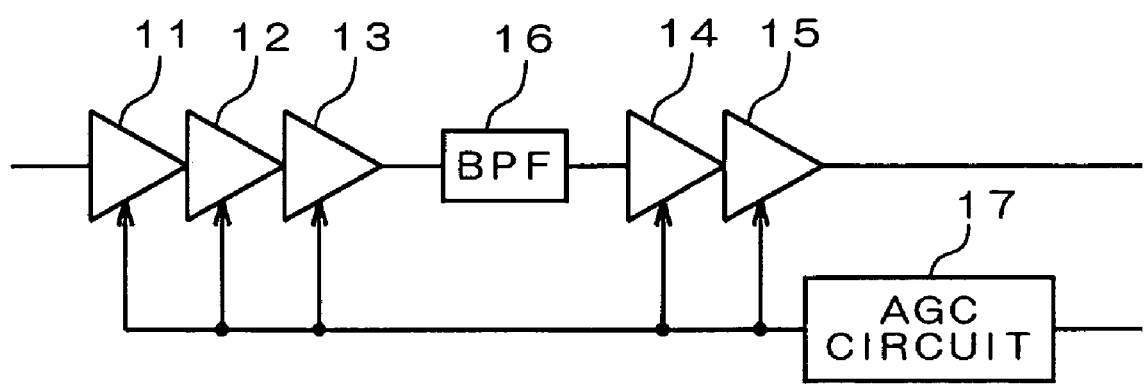
FIG. 11 is a diagram showing a configuration of the FET band amplifier shown in FIG. 2, which is added an AGC circuit.

FIG. 11 is a diagram showing the configuration in which an AGC circuit 17 is added to the FET band amplifier 5 shown in FIG. 2. The AGC circuit 17 controls the gains of the amplifiers 11 to 15 so that the level of the output signal of the final-stage amplifier 15 becomes almost constant. For this reason, in the case where a small signal is inputted to the FET band amplifier, each gain of the amplifiers 11 to 15 is set at a large value. As described above, however, the 1/f noise and thermal noise are eliminated by the BPF 16, and so the amplifiers 11 to 15 (the amplifiers 14 and 15 in particular) will not becomes saturated with these noise components and an amplification signal of little distortion can be obtained. Moreover, it is evident that the same effects can be obtained in the case of combining the FET band amplifiers according to the second and third embodiments with the AGC circuit.

INDUSTRIAL APPLICABILITY

As described above, according to the present invention, it is possible, by using the band-pass filter having a passing band wider than the amplification band, to eliminate the 1/f noise existing on a lower-frequency side than the passing band and the thermal noise existing on a higher-frequency side than that. Moreover, a noise occurring in an amplifier can be further reduced by using as an amplification element a p-channel FET having a small mobility. Therefore, it is possible to prevent the amplifiers from being saturated with these noise components, and so only the signal component to be originally amplified can be amplified so that the high gain can be obtained as the entire FET band amplifier. Furthermore, by using an FET as an amplification element, an entire FET band amplifier can be fabricated on a semiconductor substrate in a process for producing FETs (a CMOS process or a MOS process), thus making it possible to make an integration process easier and achieve a reduction of costs and savings in space, compared to the case where a bipolar transistor is used as an amplification element.

What is claimed is:

1. An FET band amplifier, comprising amplifiers of multiple stages cascaded in which FETs are used as amplification elements, wherein a channel length L and a channel width W of said FETs included in said amplifiers in the stages up to the m-th stage are set at values larger than the channel length L and the channel width W of said FETs included in said amplifiers in the stages from the m+1-th stage onward, wherein an output signal from a preceding FET is connected to a gate of a succeeding FET.

2. The FET band amplifier according to claim 1, wherein component parts are integrally formed on a semiconductor substrate by using a CMOS process or a MOS process.

3. An FET band amplifier, comprising amplifiers of multiple stages cascaded in which FETs are used as amplification elements, wherein a channel length L and a channel width W of said FETs included in said amplifiers in the stages up to the m-th stage are set at values larger than the channel length L and the channel width W of said FETs included in said amplifiers in the stages from the m+1-th stage onward, wherein component parts are integrally formed on a semiconductor substrate by using a CMOS process or a MOS process wherein said semiconductor substrate has an N-well formed thereon and all or a part of said component parts are formed on the N-well.

4. The FET band amplifier according to claim 3, wherein said semiconductor substrate has a guard ring formed around said component parts.

5. The FET band amplifier according to claim 4, wherein said guard ring is formed from said semiconductor substrate's surface down to a position deeper than said N-well.

6. An FET band amplifier, comprising amplifiers of multiple stages cascaded in which FETs are used as amplification elements, wherein, when attention is paid to said FETs included in said plurality of amplifiers connected in multiple stages as said amplification elements, the channel length L and the channel width W of said FETS included in said amplifiers placed in the foregoing stages are set at values larger than the channel length L and the channel width W of said FETs included in said amplifiers placed in the subsequent stages thereto,
wherein an output signal from an earlier FET is connected to a gate of a succeeding FET.

7. The FET band amplifier according to claim 6, wherein component parts are integrally formed on a semiconductor substrate by using a CMOS process or a MOS process.

8. An FET band amplifier, comprising amplifiers of multiple stages cascaded in which FETs are used as amplification elements,
wherein, when attention is paid to said FETs included in said plurality of amplifiers connected in multiple stages as said amplification elements, the channel length L and the channel width W of said FETS included in said amplifiers placed in the foregoing stages are set at values larger than the channel length L and the channel width W of said FETs included in said amplifiers placed in the subsequent stages thereto,
wherein component parts are integrally formed on a semiconductor substrate by using a CMOS process or a MOS process, and
wherein said semiconductor substrate has an N-well formed thereon and all or a part of said component parts are formed on the N-well.

9. The FET band amplifier according to claim 8, wherein said semiconductor substrate has a guard ring formed around said component parts.

10. The FET band amplifier according to claim 9, wherein said guard ring is formed from said semiconductor substrate's surface down to a position deeper than said N-well.

11. An FET band amplifier, comprising amplifiers of multiple stages cascaded in which FETs are used as amplification elements,
wherein, when attention is paid to said FETs included in said plurality of amplifiers connected in multiple stages as said amplification elements, the channel length L and the channel width W of each of said FETS are set so that noise component generated by the FET becomes smaller than the noise component included in an input signal of the FET,
wherein an output signal from an earlier FET is connected to a gate of a succeeding FET.

12. The FET band amplifier according to claim 11; wherein component parts are integrally formed on a semiconductor substrate by using a CMOS process or a MOS process.

13. An FET band amplifier, comprising amplifiers of multiple stages cascaded in which FETs are used as amplification elements,
wherein, when attention is paid to said FETs included in said plurality of amplifiers connected in multiple stages as said amplification elements, the channel length L and the channel width W of each of said FETS are set so that noise component generated by the FET becomes smaller than the noise component included in an input signal of the FET,
wherein component parts are integrally formed on a semiconductor substrate by using a CMOS process or a MOS process, and
wherein said semiconductor substrate has an N-well formed thereon and all or a part of said component parts are formed on the N-well.

14. The FET band amplifier according to claim 13, wherein said semiconductor substrate has a guard ring formed around said component parts.

15. The FET band amplifier according to claim 14, wherein said guard ring is formed from said semiconductor substrate's surface down to a position deeper than said N-well.

* * * * *